US010581123B2

(12) United States Patent
Hong et al.

(10) Patent No.: US 10,581,123 B2
(45) Date of Patent: Mar. 3, 2020

(54) BUS BAR AND PCB FOR VEHICLE BATTERY

(71) Applicant: Faraday&Future Inc., Gardena, CA (US)

(72) Inventors: Michael Hong, Irvine, CA (US); Kameron Fraige Saad Buckhout, Inglewood, CA (US); Daniel Arnold Sufrin-Disler, Toronto (CA)

(73) Assignee: FARADAY&FUTURE INC., Gardena, CA (US)

(*) Notice: Subject to any disclaimer, the term of this patent is extended or adjusted under 35 U.S.C. 154(b) by 502 days.

(21) Appl. No.: 15/060,416

(22) Filed: Mar. 3, 2016

(65) Prior Publication Data
US 2017/0256826 A1 Sep. 7, 2017

(51) Int. Cl.
H01M 2/34 (2006.01)
H01M 10/42 (2006.01)
G01R 31/382 (2019.01)
H01M 2/22 (2006.01)
H01M 2/10 (2006.01)
G01R 31/364 (2019.01)
H01M 2/20 (2006.01)
H01M 2/30 (2006.01)
H01M 10/48 (2006.01)

(52) U.S. Cl.
CPC ...... H01M 10/4257 (2013.01); G01R 31/364 (2019.01); G01R 31/382 (2019.01); H01M 2/1077 (2013.01); H01M 2/206 (2013.01); H01M 2/22 (2013.01); H01M 2/305 (2013.01); H01M 10/425 (2013.01); H01M 10/482 (2013.01); H01M 2220/20 (2013.01)

(58) Field of Classification Search
CPC ........... H01M 10/4257; H01M 10/482; H01M 2/206; H01M 2/305; H01M 2220/20; H01M 2/347; H01M 2/1077; H01M 2/30; H01M 2/266; H01M 2/348; H01M 2/1061; H01M 2/204; H01M 10/0525; G01R 13/3606
See application file for complete search history.

(56) References Cited

U.S. PATENT DOCUMENTS

2014/0065467 A1* 3/2014 Choi ................. H01M 2/30
429/158
2015/0295280 A1* 10/2015 Cho .................. H01M 10/425
429/158
2016/0197328 A1* 7/2016 Mack ................. H01M 2/206
429/121

* cited by examiner

Primary Examiner — Stephen J Yanchuk
(74) Attorney, Agent, or Firm — Knobbe Martens Olson & Bear LLP

(57) ABSTRACT

Disclosed herein are battery systems for electric vehicles. An electric vehicle may include a first battery. The first battery may be configured to power various low voltage systems. For example, the first battery may provide the power to start the vehicle. The vehicle may include a second battery. The second battery may be configured to power one or more electric motors for propelling the vehicle. The first battery may include a housing. The housing may include a battery monitoring system. The battery monitoring system may include a PCB that is secured to at least one bus bar. The bus bar may include an integrated shunt. The shunt may be coupled to circuitry on the PCB that is configured to monitor current.

17 Claims, 12 Drawing Sheets

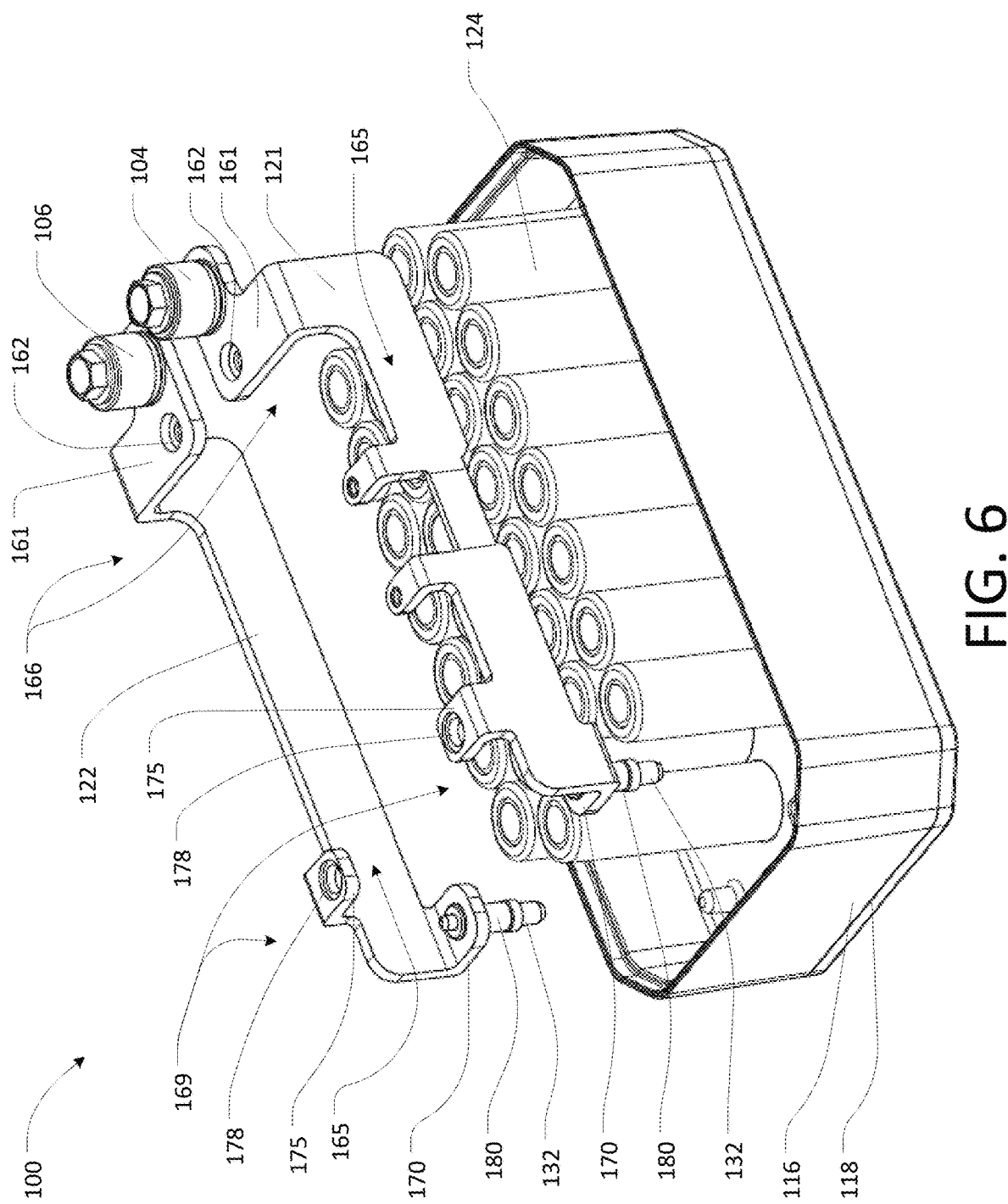

BUS BAR AND PCB FOR VEHICLE BATTERY

CROSS-REFERENCE TO RELATED APPLICATIONS

The present application is related to U.S. application Ser. No. 15/060,381, entitled "FLEXIBLE CIRCUIT FOR VEHICLE BATTERY," U.S. application Ser. No. 15/060,308, entitled "VEHICLE BATTERY HEATING SYSTEM," and U.S. application Ser. No. 15/060,331, entitled "ELECTRIC VEHICLE BATTERY," filed on the same day as the present application. Each of the above-referenced applications is hereby expressly incorporated by reference in its entirety and for all purposes.

BACKGROUND

Field of the Invention

This disclosure relates to vehicle battery systems, and more specifically to bus bar and printed circuit board (PCB) configurations in vehicle batteries.

Description of the Related Art

Electric vehicles, hybrid vehicles, and internal combustion engine vehicles generally contain a low voltage automotive battery to provide power for starting the vehicle and/or to provide power for various other electrically powered systems. Automotive batteries typically provide approximately 12 volts, and may range up to 16 volts. Such batteries are typically lead-acid batteries. In electric or hybrid vehicles, a low voltage automotive battery may be used in addition to higher voltage powertrain batteries.

SUMMARY

The systems and methods of this disclosure each have several innovative aspects, no single one of which is solely responsible for its desirable attributes. Without limiting the scope as expressed by the claims that follow, its more prominent features will now be discussed briefly.

Disclosed herein are battery systems for electric vehicles. An electric vehicle may include a first battery. The first battery may be configured to power various low voltage systems. For example, the first battery may provide the power to start the vehicle. The vehicle may include a second battery. The second battery may be configured to power one or more electric motors for propelling the vehicle. The first battery may include a housing. The housing may include a battery monitoring system. The battery monitoring system may include a PCB that is secured to at least one bus bar. The bus bar may include an integrated shunt. The shunt may be coupled to circuitry on the PCB that is configured to monitor current.

In some implementations, a battery monitoring system includes a bus bar configured to carry the output current of a battery, a printed circuit board secured to the bus bar. The printed circuit board may include circuitry configured to monitor current. A shunt may be electrically connected to the bus bar and the circuitry of the printed circuit board. The shunt may include two transverse extensions of the bus bar. The shunt and the bus bar may be formed of a single contiguous piece of electrically conductive material. The printed circuit board may have a first side and a second side. The circuitry may include at least two contact points on the first side that are electrically connected to the shunt. The bus bar may include at least one flange in contact with the first side.

In some implementations, a low voltage battery for an electric vehicle may include a housing having at least a first portion sealed to a second portion. A terminal post may extend through the housing. A plurality of rechargeable electrochemical cells may be disposed within the first portion. A bus bar may be configured to carry electrical current between the plurality of electrochemical cells and the terminal post. A printed circuit board may be disposed within the second portion. The printed circuit board may be secured to the bus bar and comprising circuitry configured to monitor current. A shunt may be electrically connected to the bus bar and the circuitry of the printed circuit board. The shunt may include two transverse extensions of the bus bar.

In some implementations, a battery monitoring system includes a housing, at least two bus bars secured to the housing, and monitoring circuitry secured to the housing and the at least two bus bars. At least a portion of the monitoring circuitry may be in direct physical and electrical contact with at least one bus bar. The monitoring circuitry may be configured to measure the current through the at least one bus bar. The at least two bus bars may be secured to the housing at least in part by a terminal post extending through the housing. The at least two bus bars may include an elongated conducting path and at least one flange extending from a top surface of each bus bar. The at least one flange may support the monitoring circuitry from above. The least two bus bars may include a connecting pin configured to electrically and mechanically couple the at least two bus bars to a battery circuit.

In some implementations, a method of manufacturing a battery monitoring system can include one or more of the following steps. The method can include securing a first bus bar to a housing wall. A second bus bar may be secured to the housing wall. A printed circuit board may be placed in contact with the first and second bus bar. The printed circuit board may be secured to the first bus bar, the second bus bar, and the housing. The method may a include connecting at least a portion of the printed circuit board to at least two different points that are spaced apart on the first bus bar. A CAM connector may be to the printed circuit board. The CAM connector may be threaded through an opening in the housing. In some aspects, the method includes electrically connecting the first and second bus bar to a plurality of electrochemical cells.

BRIEF DESCRIPTION OF THE DRAWINGS

The above-mentioned aspects, as well as other features, aspects, and advantages of the present technology will now be described in connection with various implementations, with reference to the accompanying drawings. The illustrated implementations are merely examples and are not intended to be limiting. Throughout the drawings, similar symbols typically identify similar components, unless context dictates otherwise.

FIG. 6 is a partial cutaway perspective view of the battery of FIG. 1 illustrating the primary electrical connections of the battery in accordance with an exemplary embodiment.

DETAILED DESCRIPTION OF THE PREFERRED EMBODIMENT

The following description is directed to certain implementations for the purpose of describing the innovative aspects of this disclosure. However, a person having ordinary skill in the art will readily recognize that the teachings herein can be applied in a multitude of different ways. In some implementations, the word "battery" or "batteries" will be used to describe certain elements of the embodiments described herein. It is noted that "battery" does not necessarily refer to only a single battery cell. Rather, any element described as a "battery" or illustrated in the Figures as a single battery in a circuit may equally be made up of any larger number of individual battery cells and/or other elements without departing from the spirit or scope of the disclosed systems and methods.

Reference may be made throughout the specification to "12 volt" power systems or sources. It will be readily apparent to a person having ordinary skill in the art that the phrase "12 volt" in the context of automotive electrical systems is an approximate value referring to nominal 12 volt power systems. The actual voltage of a "12 volt" system in a vehicle may fluctuate as low as roughly 4-5 volts and as high as 16-17 volts depending on engine conditions and power usage by various vehicle systems. Such a power system may also be referred to as a "low voltage" system. Some vehicles may use two or more 12 volt batteries to provide higher voltages. Thus, it will be clear that the systems and methods described herein may be utilized with battery arrangements in at least the range of 4-34 volts without departing from the spirit or scope of the systems and methods disclosed herein.

Figure 2:
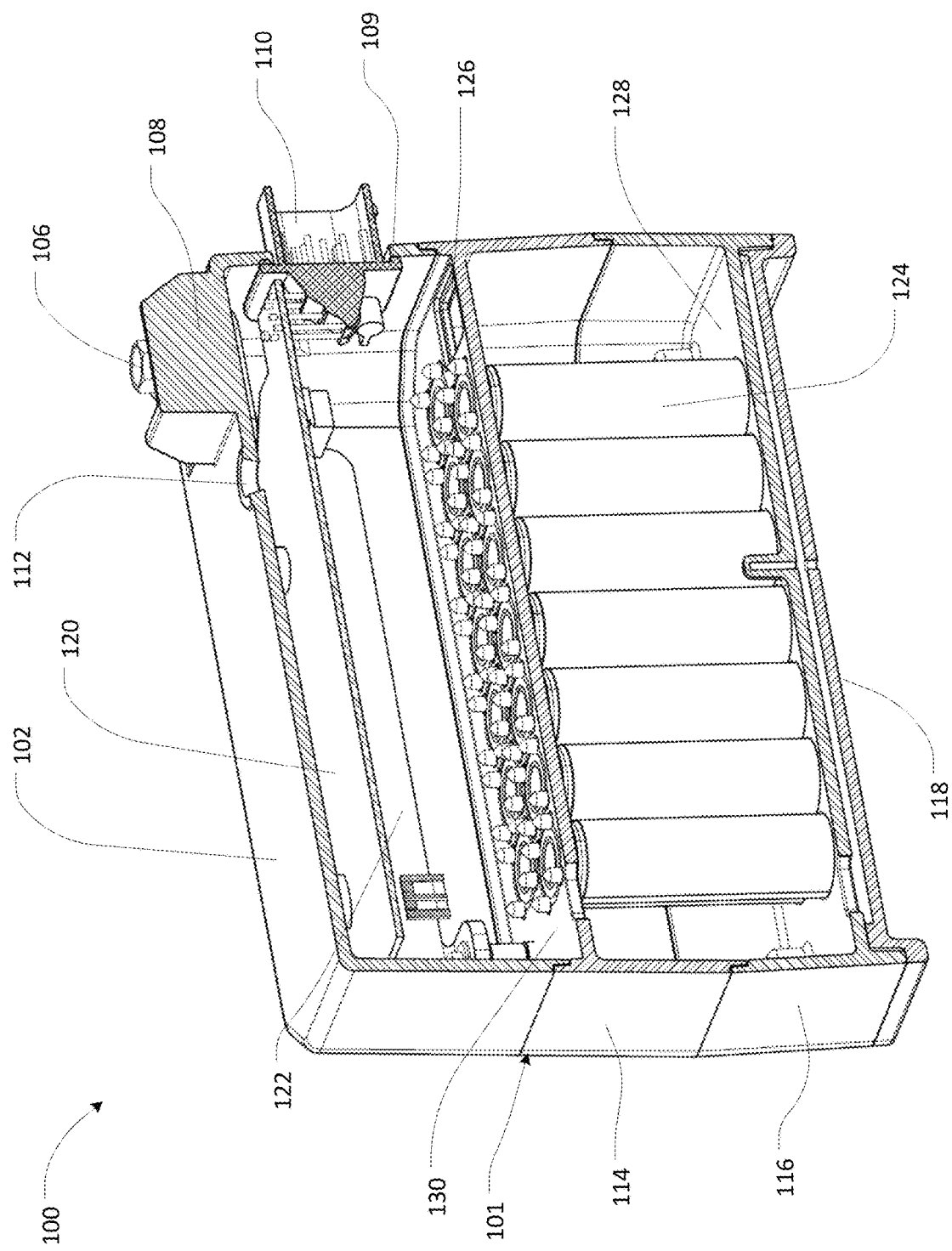
FIG. 2 is a cross sectional view of an assembled battery of FIG. 1.

To assist in the description of various components of the battery systems, the following coordinate terms are used (see, e.g., FIGS. 2-5). A "longitudinal axis" is generally parallel to the longest dimension of the battery housing embodiments depicted. A "lateral axis" is normal to the longitudinal axis. A "transverse axis" extends normal to both the longitudinal and lateral axes. For example, the cross sectional view of FIG. 2 depicts a plurality of cylindrical cells; each cell is oriented parallel to the transverse axis, while the cells are oriented in a row of seven cells along a line parallel to the longitudinal axis.

In addition, as used herein, "the longitudinal direction" refers to a direction substantially parallel to the longitudinal axis, "the lateral direction" refers to a direction substantially parallel to the lateral axis, and the "transverse direction" refers to a direction substantially parallel to the transverse axis.

The terms "upper," "lower," "top," "bottom," "underside," "top side," "above," "below," and the like, which also are used to describe the present battery systems, are used in reference to the illustrated orientation of the embodiment. For example, as shown in FIG. 2, the term "top side" may be used to describe the surface of the battery housing containing the positive and negative terminal posts, while the term "bottom" may be used to describe the location of the baseplate.

Traditional gasoline powered cars typically include a low voltage SLI (starting, lighting, ignition) battery. Similarly, electric vehicles may include a low voltage SLI battery along with a high voltage battery system having significant energy storage capacity and suitable for powering electric traction motors. The low voltage battery may be necessary to provide the startup power, power an ignition, close a high voltage battery contactor, and/or power other low voltage systems (e.g. lighting systems, electronic windows and/or doors, trunk release systems, car alarm systems, and the like).

In addition to powering the vehicle's propulsion motors, the high voltage batteries' output may be stepped down using one or more DC-to-DC converters to power some or all of the other vehicle systems, such as interior and exterior lights, power assisted braking, power steering, infotainment, automobile diagnostic systems, power windows, door handles, and various other electronic functions when the high voltage batteries are engaged.

High voltage batteries may be connected to or isolated from other vehicle circuitry by one or more magnetic contactors. Normally open contactors require a power supply in order to enter or remain in the closed circuit position. Such contactors may be configured to be in the open (disconnected) configuration when powered off to allow the high voltage batteries to remain disconnected while the vehicle is powered off. Thus, on startup, a small power input is required to close at least one contactor of the high voltage battery pack. Once a contactor is closed, the high voltage batteries may supply the power required to keep the contactor(s) closed and/or supply power to other vehicle systems.

Particular embodiments of the subject matter described by this disclosure can be implemented to realize one or more the following potential advantages. Rather than using a traditional lead-acid automobile battery, the present allows for a smart rechargeable battery that does not require a fluid filled container. In some aspects, one or more individual cells in a housing may be monitored individually or in subsets. In some aspects, additional individual cells may be provided within the housing such that the connected cells can provide more voltage than necessary to compensate for the potential of the loss of one or more of the cells. The disclosed design may be easier and/or less expensive to manufacture. For example, the number of manufacturing steps may be minimized and the labor may be simplified and/or made more efficient. For example, two halves of a battery housing may be assembled separately and electrical components may later be coupled together in one final step when the two housing halves are combined. Such a construction may minimize the number of sealing steps while sensitive parts are contained within the housing. A desiccant may be provided to remove excess moisture in the housing in order to further protect the electric components and/or cells within the housing. A valve may help prevent unsafe pressures from building up within the housing. In some aspects, the housing may be designed such that the parts inside the housing are inhibited from moving excessively and/or vibrating excessively while a vehicle is operated.

These, as well as, other various aspects, components, steps, features, objects benefits, and advantages will now be described with reference to specific forms or embodiments selected for the purposes of illustration. It will be appreciated that the spirit and scope of the cassettes disclosed herein is not limited to the selected forms. Moreover, it is to be noted that the figures provided herein are not drawn to any particular proportion or scale, and that many variations can be made to the illustrated embodiments.

Figure 1:
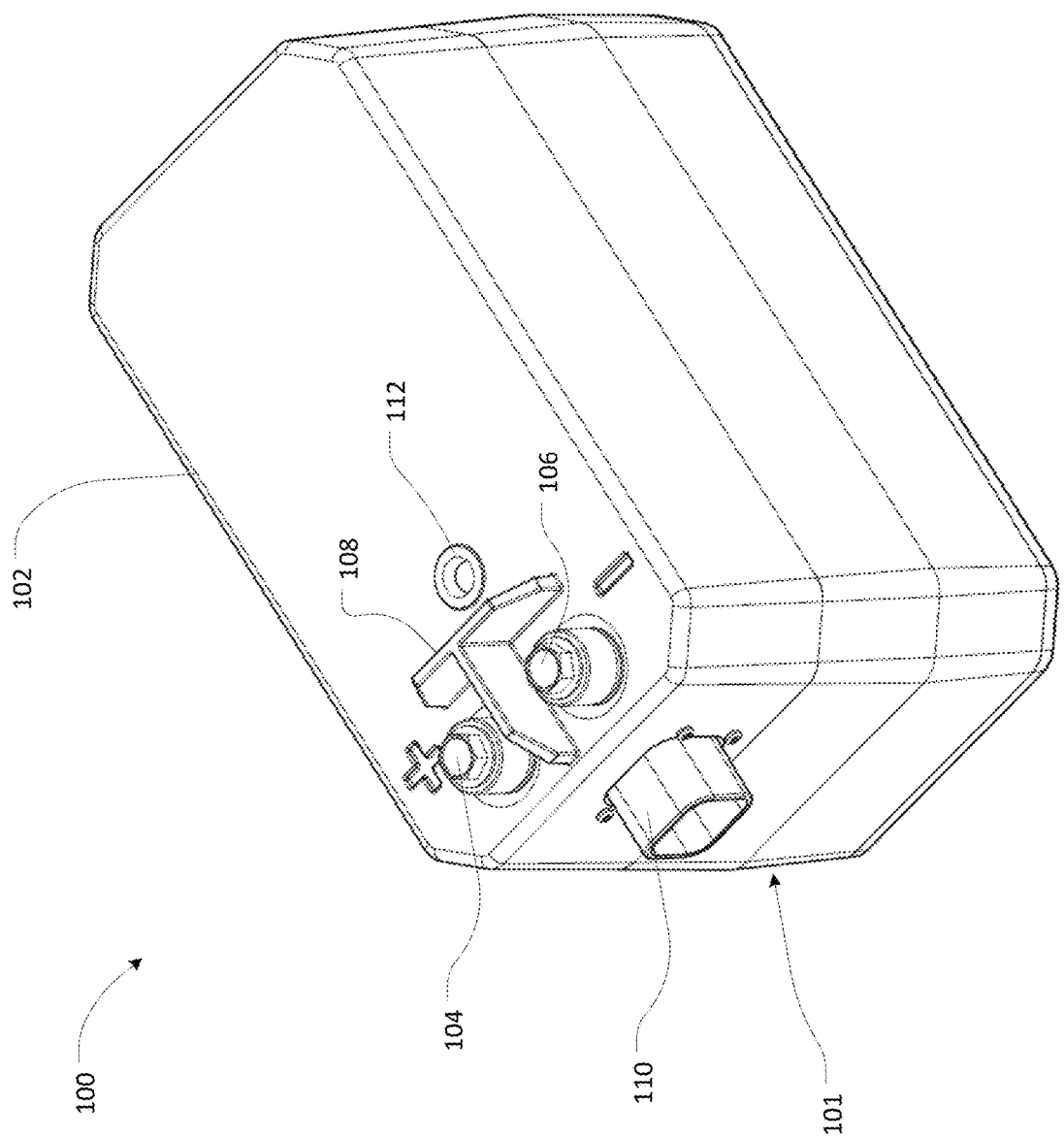
FIG. 1 is a top perspective view of an assembled low voltage automotive battery in accordance with an exemplary embodiment.

FIG. 1 is a top perspective view of an assembled battery 100 in accordance with an exemplary embodiment. The exterior of the lid 102 of the battery housing 101 includes a positive terminal post 104, a negative terminal post 106, a terminal post protection structure 108, a CAN connector 110, and a pressure vent 112. The positive terminal post 104 and negative terminal post 106 are connected to the interior components via internal bus bars and circuitry as described with reference to FIGS. 1 and 2.

The terminal post protection structure 108 may be formed as a single piece with the housing lid, for example, by molding or 3D printing. The protection structure 108 is provided in order to protect the terminal posts 104 and 106 from unintentional or harmful contact. In addition, the protection structure 108 can prevent inadvertent creation of a short circuit between the terminal posts 104 and 106. For example, if a vehicle owner or mechanic drops a metal tool across the terminal posts 104 and 106 while performing maintenance, a short circuit is created. If the owner or mechanic attempts to retrieve the tool while it is in contact with both posts 104 and 106, severe electric shock may result. Thus, the terminal post protection structure 108 should include a longitudinal portion raised in the transverse direction far enough that a straight metal tool cannot touch both terminal posts 104 and 106 at the same time.

The valve 112 may be a waterproof pressure relief valve, such as a GORE protective vent. A waterproof pressure relief valve may allow the pressure within the battery housing to equalize with the outside air pressure while preventing the low-humidity atmosphere within the battery 100 from being compromised. The valve 310 is described in greater detail with reference to FIG. 2.

FIG. 2 depicts a cross sectional view of an assembled battery 100 in accordance with an exemplary embodiment. The unitary battery housing 101 comprises a lid 102 and a lower portion including an upper housing body 114, a lower housing body 116, and a baseplate 118. The lid 102 includes the pressure vent 112, negative terminal post 106, terminal post protection structure 108, and an opening 109 for the CAN connector 110, as shown in the exterior view of FIG. 1.

Within the housing 101, the CAN connector 110 may be in electrical communication with a monitoring and control PCB 120. The terminal post 106 is in electrical contact with a bus bar 122. The bus bar 122 may include a shunt (not shown) providing an electrical connection to the PCB 120 to allow the PCB to measure the current in the bus bar. Other circuitry (not shown) in electrical contact with the bus bar 122 is further connected electrically to a plurality of electrochemical cells 124. A desiccant holder 126 may also be located within the housing 101.

The cross sectional view of FIG. 2 illustrates several advantages of the battery 100 over conventional designs. The unitary housing 101 provides a sealed environment for all internal components of the battery 100. In many existing automotive battery designs, the battery components are held in place by an internal structure, with an additional external protective structure, or blast shield, required to protect the battery 100 and maintain the desired interior conditions. Instead, the present battery housing 101 may contain integrated interior structural components to eliminate the need for additional interior components. For example, the lower housing body 116 described above may include an integrated lower cell holder framework 128, comprising an array of cylindrical openings sized to secure one end of each of the electrochemical cells 124. Similarly, the upper housing body 114 described above may include an integrated upper cell holder framework 130, comprising an array of cylindrical openings sized and arranged identically to the openings of the lower cell holder framework 128, so as to secure the opposite end of each of the electrochemical cells 124. Thus, the cells 124 may be held in place within the housing 101. In some embodiments, the portion of the lower space surrounding the cells 124 may be filled with an electronics potting compound to further secure the cells 124 in place and/or to reduce the effects of vibrations or other mechanical stresses on the battery 100. The potting compound may be any suitable gelatinous or solid compound, such as a silicone or other rubber gel, thermal setting plastics, epoxy, or the like.

The battery housing 101 will preferably be sealed or substantially sealed at all joints and ports so as to provide a stable environment for the electrochemical cells 124. Pressure and humidity variations may have significant detrimental effects on the battery 100. More specifically, the interior of the battery 100 should be kept at substantially the same pressure as the ambient air pressure to avoid excessive wear to the battery housing, seals, or other components. The interior of the housing 101 should also be kept relatively dry, as condensation or excess humidity may shorten battery life. Thus, a combination of environmental features may be provided to optimize moisture and pressure conditions within the battery 100.

Environmental control features may include a waterproof pressure relief valve 112, such as a GORE protective vent, and/or a desiccant contained within the desiccant holder 126. The waterproof pressure relief valve 112 may allow the pressure within the battery housing 101 to equalize with the outside air pressure while preventing liquids from entering the battery 100. Although some moisture may enter the battery 100 as air passes through the waterproof valve 112, the moisture may be removed within the battery 100 by a desiccant in the desiccant holder 126.

The desiccant within the battery housing 101 can be configured to absorb any moisture initially inside the housing 101 after manufacture, and may later absorb moisture from the air entering the battery housing 101 through the waterproof pressure valve 126 or a crack or hole in the material of the housing 101. In some embodiments, the upper cell holder framework 130 may also serve as a support for the desiccant holder 126. The desiccant holder 126 may be located near the cells 124 within the battery housing 101 so as to most effectively dry the air around the cells 124. However, the desiccant holder may be effective if located in any location within the battery housing 101.

The desiccant within the desiccant holder 126 may include a variety of desiccating or hygroscopic materials, such as silica gel, calcium sulfate, calcium chloride, activated charcoal, zeolites, Drierite, or any other suitable desiccant.

Figure 3:
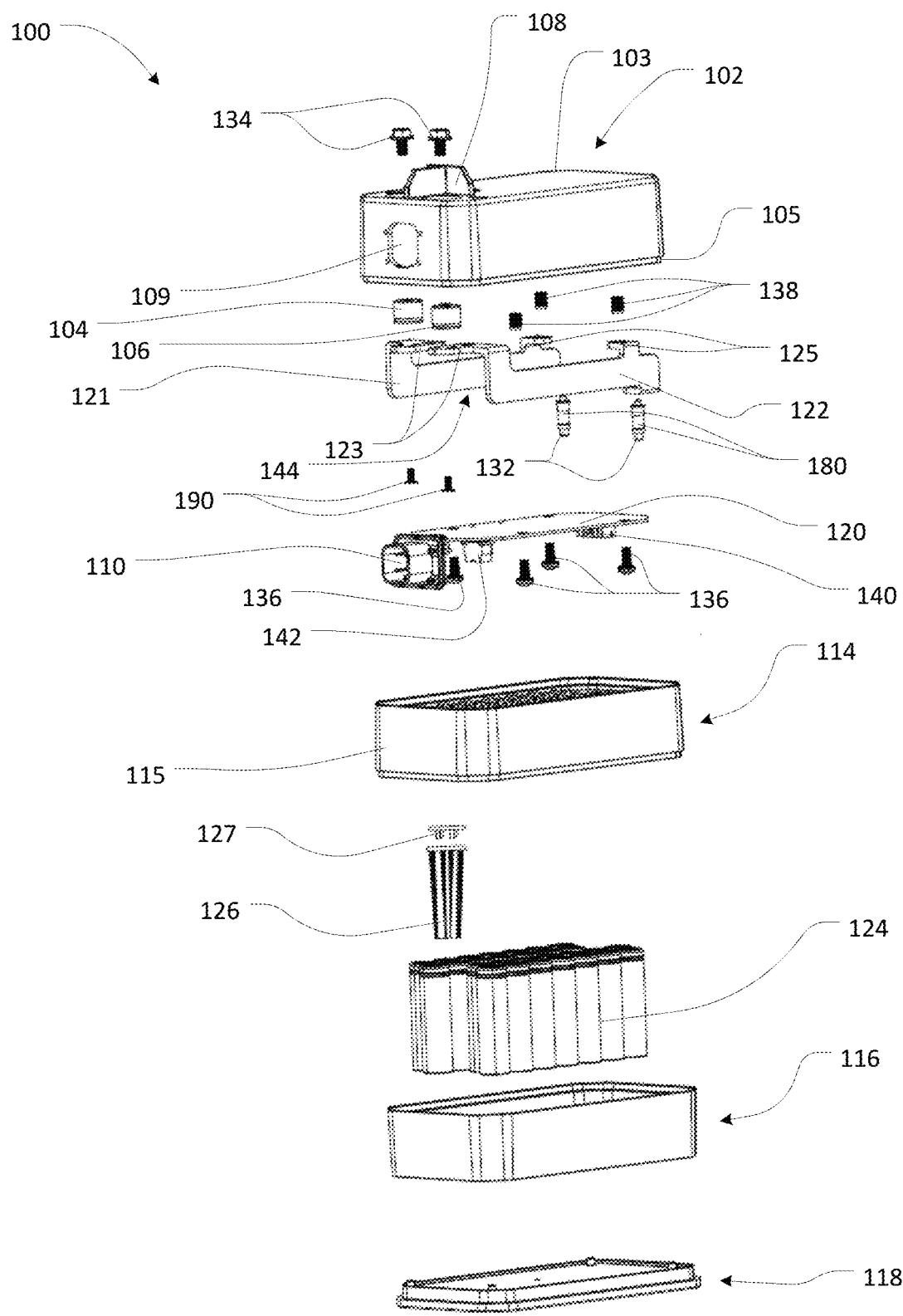
FIG. 3 is an exploded view of an automobile battery of FIG. 1.

FIG. 3 depicts an exploded view of the automotive battery 100 expanded along the transverse axis. As shown, the battery 100 includes a plurality of electrochemical cells 124 contained within a housing comprising a housing lid 102, an upper housing body 114, a lower housing body 116, and a housing baseplate 118, which can be joined, sealed, or welded to form a unitary battery housing. The upper housing body 114 has an upper edge 115. The lid 102 has an upper surface 103 and a lower edge 105. During manufacturing, the upper edge 115 of the upper housing body may be sealingly fitted into, around, or against the lower edge 105 of the lid 102. Such a seal may be formed, for example, using an appropriate sealant, adhesive, weld, vibratory weld, and the like. The lid 102 includes terminal post protection structure 108 on its upper surface 103.

The housing may further contain a desiccant holder 126. A desiccant holder cover 127 may help contain the desiccant within the desiccant holder 126. Such a cap 127 may removably coupled to the desiccant holder 126 via a snap-fit, screw-fit, or other similar configuration.

Continuing with FIG. 3, a positive bus bar 121 and a negative bus bar 122 are disposed within the upper housing body 114 and/or the lid 102, and in electrical contact with the electrochemical cells 124 via connecting pins 132 and other circuitry (not shown). As discussed in more detail below, the connecting pins 132 may be passed through insulating sockets 180.

Terminal posts 104 and 106 extend through the housing lid 102 to the exterior of the battery 100 and are in electrical communication with the positive bus bar 121 and the negative bus bar 122. The terminal posts 104 and 106 are secured by terminal post fasteners 134. The bus bars 121 and 122 may be held to the lid 102 by flanges 123 and 125 and secured with fasteners 136 and inserts 138. Monitoring and control printed circuit board (PCB) 120 is disposed within an upper portion of the housing and may be configured to monitor the actual voltage across each cell 124 or a set of cells 124, or to monitor the current flowing into or out of the battery 100 through bus bars 121 and 122. Battery current monitoring is made possible by a shunt 144 providing two points of electrical contact between a bus bar 121 or 122 and the PCB. The PCB may include elements such as a terminal power header 140 and a thermistor connector 142. The PCB 120 is in electrical communication with the CAN connector 110 which extends through the housing lid 102 at opening 109 to the exterior of the battery 100. The PCB 120 may be supported in place by the CAN connector 110 as well as by the lid 102 and/or bus bars 121 and 122, and may be secured to the lid 102 and/or bus bars 121 and 122 by fasteners 136.

The electrochemical cells 124 are configured to provide direct current power. In some embodiments, the cells 124 may provide sufficient voltage to power a nominal 12-volt automotive power system. The cells 124 may be any variety of electrochemical cell, such as lithium ion, nickel metal hydride, lead acid, or the like. In some embodiments with multiple electrochemical cells 124, the cells 124 may be arranged in any combination of parallel and series connections. For example, a battery delivering a maximum of 15.6 volts may include a single string of four 3.9-volt cells connected in series, multiple 4-cell serial strings connected in parallel, or four serially connected strings of multiple parallel cells, so as to provide a greater energy storage capacity at the same voltage of 15.6 volts.

The housing components 102, 114, 116, and 118 may be assembled at various times during manufacturing to form one housing structure. In some embodiments, housing components 102, 114, 116, and 118 may be glued or otherwise adhered together to form a single housing unit. In embodiments where the housing components are made of a plastic, the housing components may be joined by any suitable variety of plastic welding, such as hot gas welding, hot plate welding, contact welding, speed tip welding, laser welding, solvent welding, or the like, to form a robust protective housing. In some embodiments, the housing may be an integrated unit containing internal structure such as compartments for the electrochemical cells 124, so as to avoid the additional weight and complexity associated with having separate internal structural components.

Figure 4:
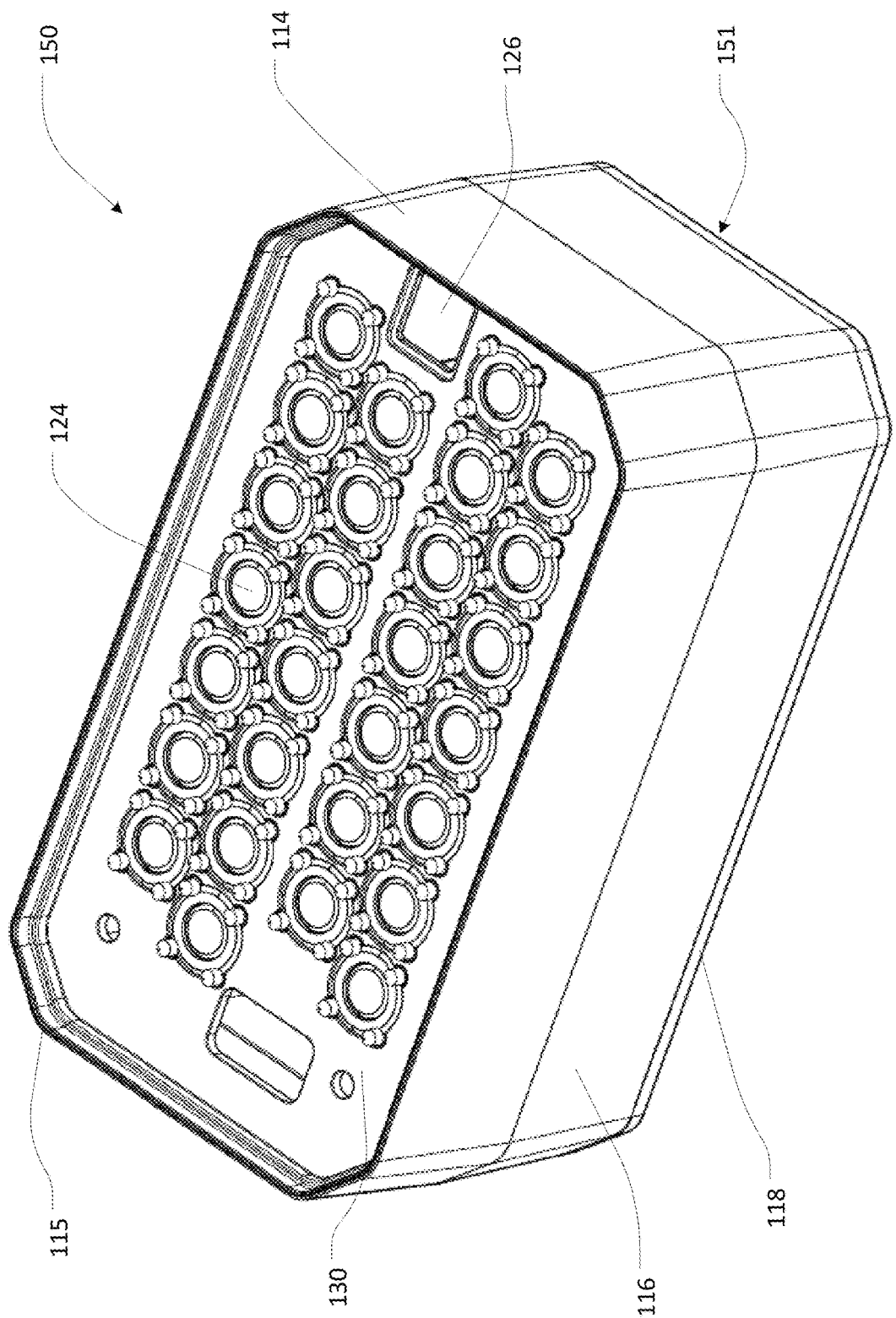
FIG. 4 is a perspective view of the lower portion of the battery of FIG. 1 as prepared for final assembly in accordance with an exemplary embodiment.
Figure 5:
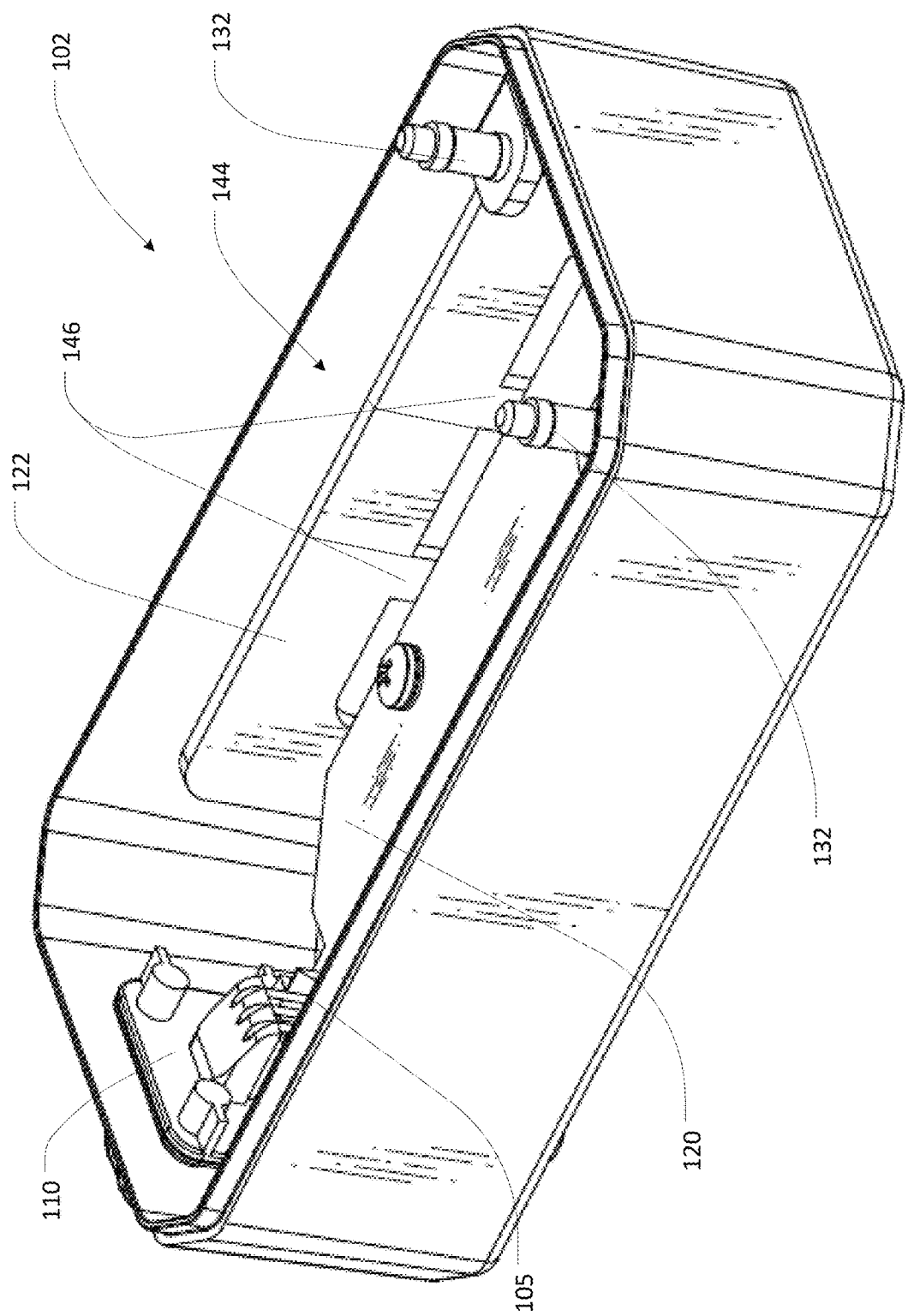
FIG. 5 is a perspective view of the upper portion of the battery of FIG. 1 prepared for final assembly in accordance with an exemplary embodiment. When assembled, the top portion may be inverted from its position shown in FIG. 5 and placed on top of the lower portion shown in FIG. 4 to form an assembled housing as shown in FIG. 3.

With reference to FIGS. 4 and 5, a simplified battery assembly process will now be described. In some aspects, the simplicity and efficiency of the battery assembly process are a result of various battery features described elsewhere herein. FIG. 4 depicts a lower portion 150 of a battery before final assembly. FIG. 5 depicts a lid 102 of a battery before final assembly, in an inverted orientation. A lower portion housing 151 may include the housing components 114, 116, and 118 described above, and may be manufactured with an upper interior framework 130 and lower interior framework 128 (not shown) for holding a plurality of electrochemical cells 124 and a desiccant holder 126, as described above with reference to FIGS. 2 and 3.

As will be discussed in greater detail below, a bus bar assembly may be secured within the lid 102 or first housing portion. The bus bar assembly may include a negative bus bar 122 and a positive bus bar 121 (not shown). The negative bus bar 122 and a positive bus bar 121 may generally have a first end and a second end. The first end of the negative bus bar 122 and positive bus bar 121 may generally terminate at positive and negative terminal posts 104 (not shown) and 106 (not shown) respectively. As shown, the terminal posts 104, 106 may extend at least partially through the lid 102 or first housing portion. The second end of each bus bar may generally terminate at a connecting pin 132. The connecting pins 132 may be configured to connect with the circuitry that electrically connects the plurality of cells continued within the second housing portion. The connecting pins 132 may be configured such that the pins 132 need not be welded or soldered. Rather the pins 132 may be configured to engage with at least a portion of the circuit such that a mechanical and electrical connection between the bus bars and the circuity is formed. In some implementations, the pins 132 form a snap fit connection the circuity.

A PCB 120 for battery monitoring and control may then be secured to the housing lid 102 and/or bus bars 121, 122 (not shown). A CAN connector 110 connecting to the PCB 120 through the housing lid 102 may also be included. One of the two bus bars 121 (not shown) or 122 may further include an integrated shunt 144, comprising two shunt arms 146 which may connect to connection points (not shown) on the PCB 120. In some embodiments, the step of securing the PCB 120 to the bus bars 121 and 122 automatically creates an electrical connection between the shunt arms 146 and current measuring circuitry (not shown) of the PCB 120, eliminating the need for any further leads, wires, or other electrical connections. Thus, an additional step of connecting the shunt arms 146 to current measuring circuitry may be eliminated. Connections between the bus bars 121, 122 and the PCB 120 are discussed in greater detail with reference to FIGS. 7A-8.

With a completed battery lid 102 and lower battery portion 150, final assembly of the battery is straightforward and suitable for completion on an assembly line or similar high-capacity production line. The plurality of electrochemical cells 124 are inserted into the cylindrical openings in the interior framework 130 of the lower portion housing 151, and a desiccant holder 124 containing desiccant is inserted into the appropriate opening. Circuitry (not shown) configured to connect the cells 124 to the bus bars 121 and 122 may be placed on top of the cells 124. In a final assembly step, the lid 102 is turned upright, placed atop the lower portion 150 and pressed downward to couple the lower edge 105 of the housing lid to the upper edge 115 of the lower portion housing 151. At the same time, bus bar connecting pins 132 will form a press-fit connection to circuitry (not shown) of the lower portion 150, completing the electrical connection between the terminal posts and the electrochemical cells 124 via the bus bars 121 and 122, connecting pins 132, and other circuitry. The housing lid 102 and lower portion housing 151 are sealed at their intersection by any suitable form of plastic welding to complete the assembly.

FIG. 6 depicts a cutaway view of a battery 100 showing only the primary electrical connections of the battery 100 after final assembly. As used herein, the term "primary electrical connections" of the battery 100 refers to the conductive path between the electrochemical cells 124 and the terminal posts 104 and 106, by which the electrochemical cells 124 provide nominal 12 volt electrical power to various vehicle systems. Thus, the primary electrical connections do not include other conductive connections to the battery circuit such as control or monitoring systems. The primary electrical connections include the electrochemical cells 124, connecting pins 132, bus bars 121 and 122, terminal posts 104 and 106, and other circuitry (not shown) connecting the cells 124 to the connecting pins 132. For clarity, the baseplate 118 and lower housing body 116 are also depicted. Thus, current can flow between the negative terminal post 106 and the negative terminal of the cells 124 by traveling through the negative bus bar 122, connecting pin 132, and other circuitry (not shown). Similarly, current can flow between the positive terminal of the cells 124 and the positive terminal post 104 by traveling through the other circuitry (not shown), connecting pin 132, and positive bus bar 121.

Continuing with FIG. 6, details of the bus bars 121, 122 will now be described. As shown, each bus bar 121, 122 includes an elongated center portion 165 extending along the longitudinal axis having a first end portion 169 and a second end portion 166. The end portion 169 may include a laterally extending underside flange 170. The underside flange 170 may include an opening having a connecting pin 132 at least partially disposed therein. The pin 132 may pass through an insulated socket 180. While FIG. 6 shows the pin 132 inserted through the socket 180 and into the opening in the underside flange 170, the pin 132 may be a separate piece and/or may be disposed at least partially within a circuit below (not shown). In some aspects, the pin 132 and the underside flange 170 are a unitary construction. In some aspects, the pin 132, the socket 180, and the underside flange 170 are a unitary construction. The pin and socket may be methode EBC standard 3.6 mm pins and sockets.

As shown in FIG. 6, each bus bar 121, 122 may include a topside flange 175 spaced longitudinally away from the underside flange 170. The topside flange 175 may include at least one opening 178 therethrough. The topside flange 175 may be used to support the PCB from below during the manufacturing process. The topside flange 175 may be used to support the PCB from above when the battery is in use.

The second end portion 166 of each bus bar 121, 122 may include top side terminal flange 161. The top side terminal flange 161 may include a plurality of openings extending therethrough. At least one opening 162 may be used to receive a bus bar to upper cover fastener 190 (shown in FIG. 3). A second opening (not shown) may be used to receive at least a portion of a terminal post 104, 106. The top side terminal flange 161 may contact the underside of the first housing portion and may be secured to the same by a bus bar to upper cover fastener 190 passed through the opening 162.

Figure 7A:
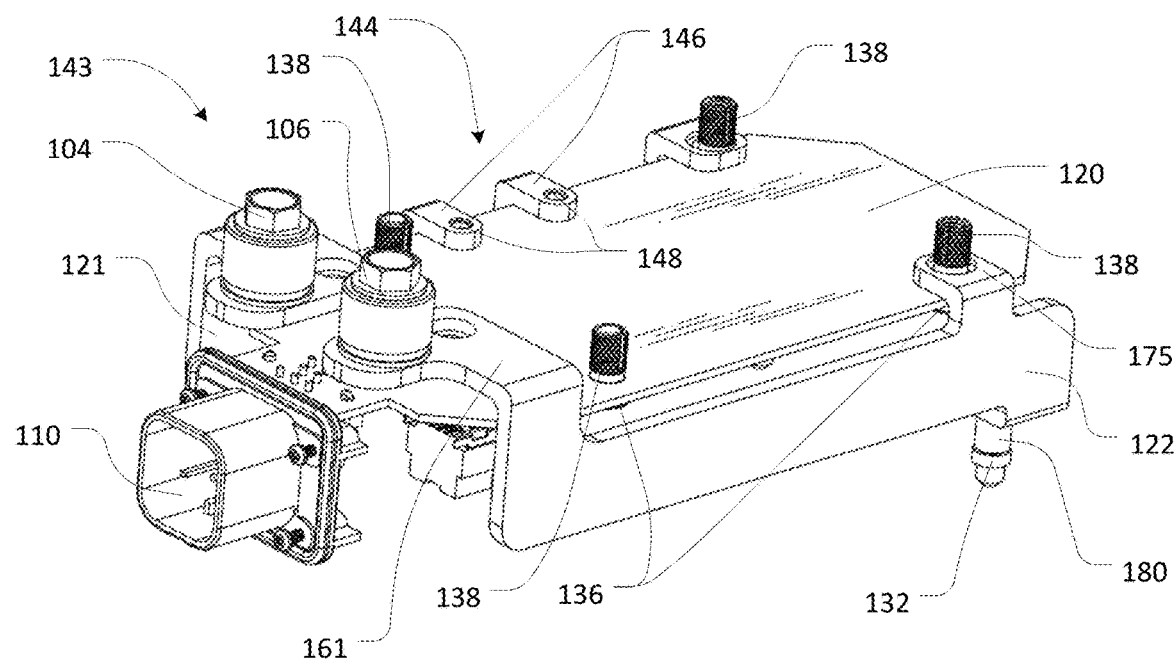
FIG. 7A and FIG. 7B are side perspective views of a bus bar and PCB configuration within the battery of FIG. 1 in accordance with an exemplary embodiment.
Figure 7B:
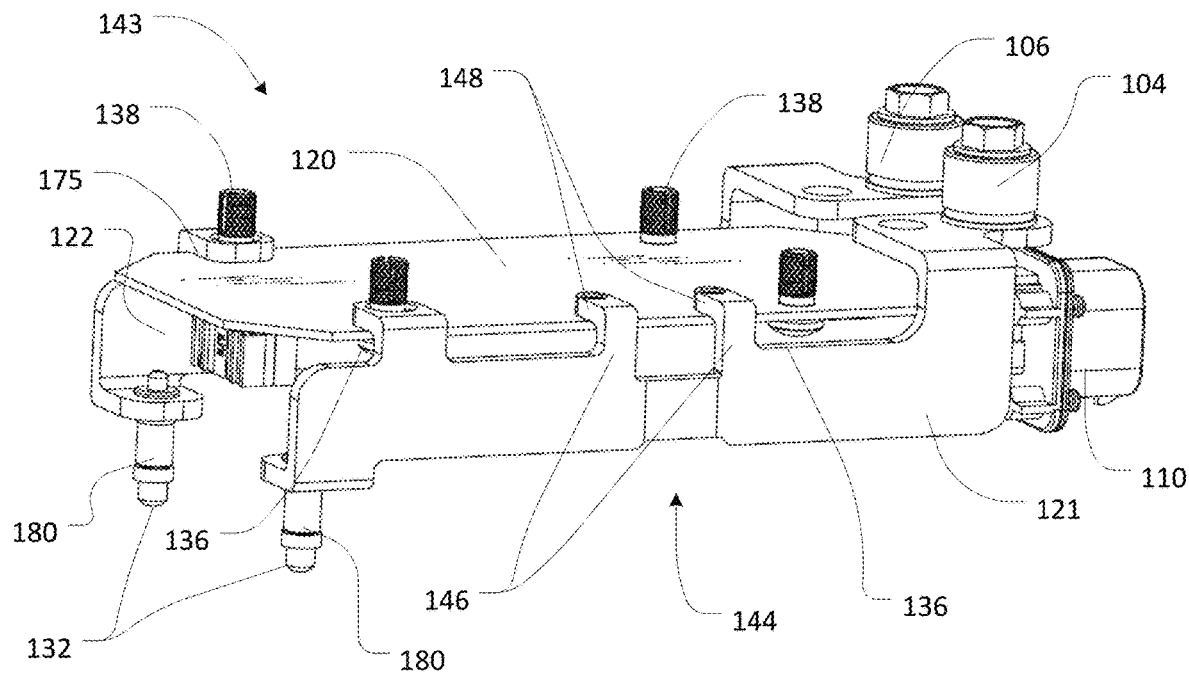

FIGS. 7A and 7B show an example bus bar-PCB unit 143 and illustrate the application of an integrated shunt 144 to connect a bus bar 121 or 122 to a battery monitoring PCB 120. As described above, bus bars 121 and 122 carry the electrical current of the battery 100 between the terminal posts 104 and 106, and the battery connection circuitry (not shown), via connecting pins 132. The PCB 120 may be secured to the battery housing (not shown) and connected to external circuitry at a CAN connector 110. The PCB 120 may further be secured to the bus bars 121 and 122 and to the battery housing (not shown) by fasteners 136.

In the configuration depicted in FIGS. 7A and 7B, the total battery current may be measured by measuring the current flowing through the positive bus bar 121 by means of a shunt 144. The shunt 144 includes shunt arms 146 extending from the bus bar 121 to connect to the PCB 120 at connection points 148. At connection points 148, the shunt arms 146 may connect to current measuring circuitry (not shown) contained on the PCB. As will be described with reference to FIG. 8, current measuring circuitry may use the voltage drop measured between the shunt arms 146 to calculate the total current flowing through the bus bar 121.

The configuration of bus bars 121 and 122 and PCB 120 as depicted in FIGS. 7A and 7B, including the integrated shunt 144 described above, provides several advantages over other configurations. Locating the battery monitoring PCB 120 near the main current-carrying bus bars 121 and 122 allows for simplified connections between the bus bars 121 and 122 and the PCB 120 without requiring wires, leads, or other extended connections. Instead, a shunt 144 may be shaped to directly contact circuitry on the PCB 120 during assembly. Moreover, integrating the shunt 144 with a bus bar 121 makes the entire assembly of bus bars 121 and 122 and PCB 120 more robust while reducing cost and weight. For example, a non-integrated shunt would have to be connected to the bus bar 121 at both ends by bolts or other securing hardware. Securing a non-integrated shunt to the bus bar 121 may add weight to the battery, and/or add additional time and complexity to the manufacturing process.

In addition, because the shunt-bus bar connection points may be weaker than the remainder of the bus bar structure, an integrated bus bar may reduce the probability of accidental bending or breaking of the bus bar-PCB unit 143 due to impact, vibration, or improper assembly. Fasteners 136 may accomplish the dual purposes of securing the PCB 120 to the bus bars 121 and 122, and securing the entire bus bar-PCB unit 143 to the lid (not shown) of the battery housing (not shown), as described with reference to FIG. 5, again reducing complexity in the manufacturing process.

As shown in FIGS. 7A-7B, the topside flange 175 may be used to support the PCB 120 from above when the battery is in use. The flange may be configured such that an electrical connection between the underside of the flange and the top side of the PCB (and/or circuitry thereon) is not formed and/or prevented from being formed. For example, the underside of the flange may be coated with an insulating material or formed from a material that is cannot conduct electricity. In another example, the portion of the top side of the PCB in contact with the flange may include insulating material. In the illustrated embodiment, four board to cover fasteners 136 and four threaded inserts 138 are used to secure the PCB 120 in place. In this way, the two bus bars 121, 122 help mechanically secure the PCB 120 in place within the battery housing.

Figure 8:
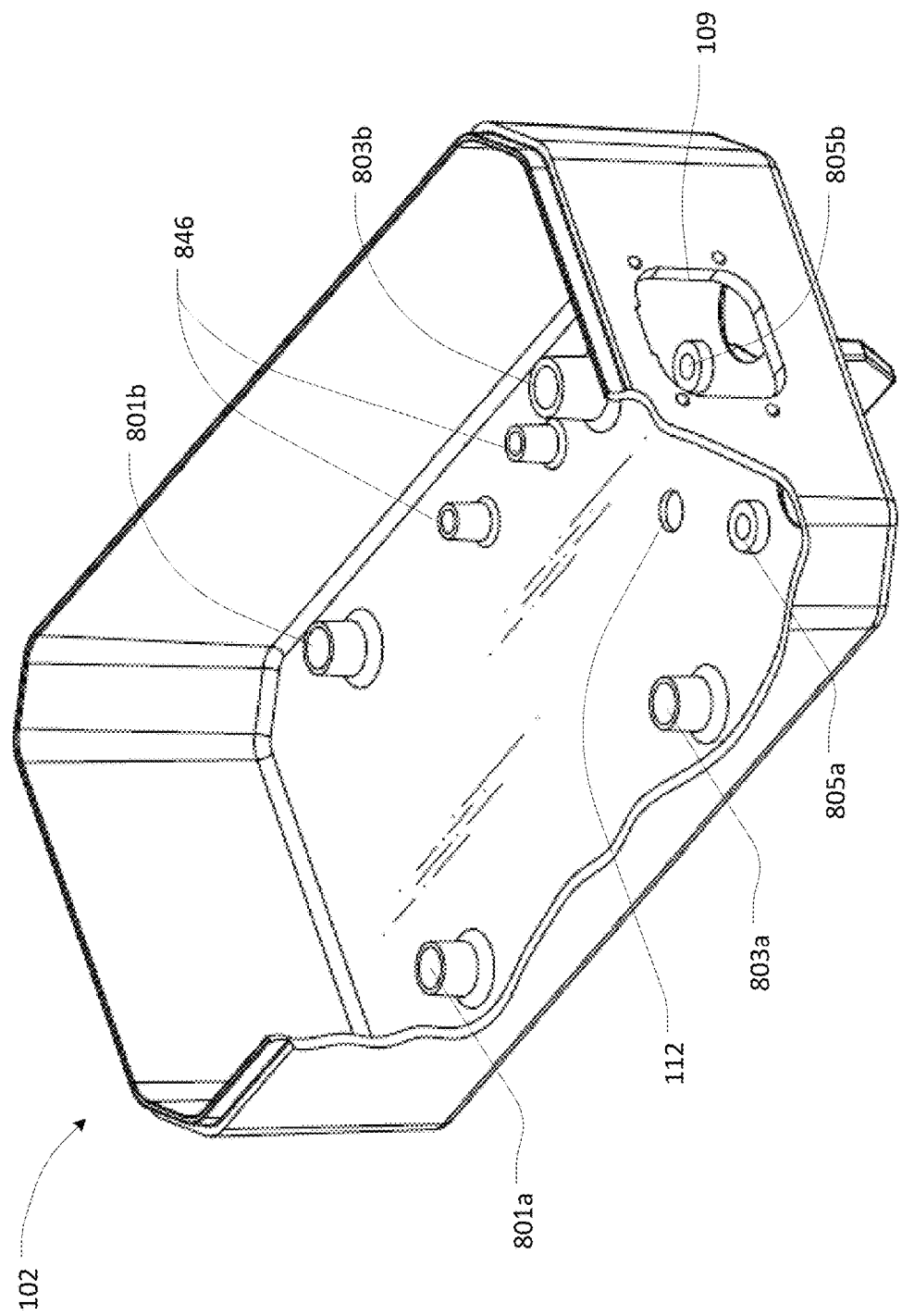
FIG. 8 is a perspective view of the underside of the upper housing portion from FIGS. 1-3.

FIG. 8 illustrates the underside of the upper housing portion 102. As shown, the housing portion may include a plurality structures extending from the underside of the housing. Such structures can aid in securing the bus bars and/or PCB to the upper housing portion 102 and can also properly position various structures during manufacturing. In this way, corresponding structures can be mated when the two housing portions are secured to one another. As illustrated in FIG. 8, locators 801*a-b* and 803*a-b* can be configured to snugly receive the four threaded inserts 138 (shown in FIGS. 7A-7B). As such, the PCB can be at least partially secured to the upper housing portion 102. Locators 805*a-b* can be configured to receive the bus bar to upper cover fasteners 190 (shown in FIG. 3). Locators 846 can be configured to connect with the shunt arms 146 at connection points 148 (shown in FIGS. 7A-7B). Thus the bus bars 121, 122 are secured to the upper housing portion 102 as well. Opening 109 can be shaped to receive the CAN connector.

Figure 9:
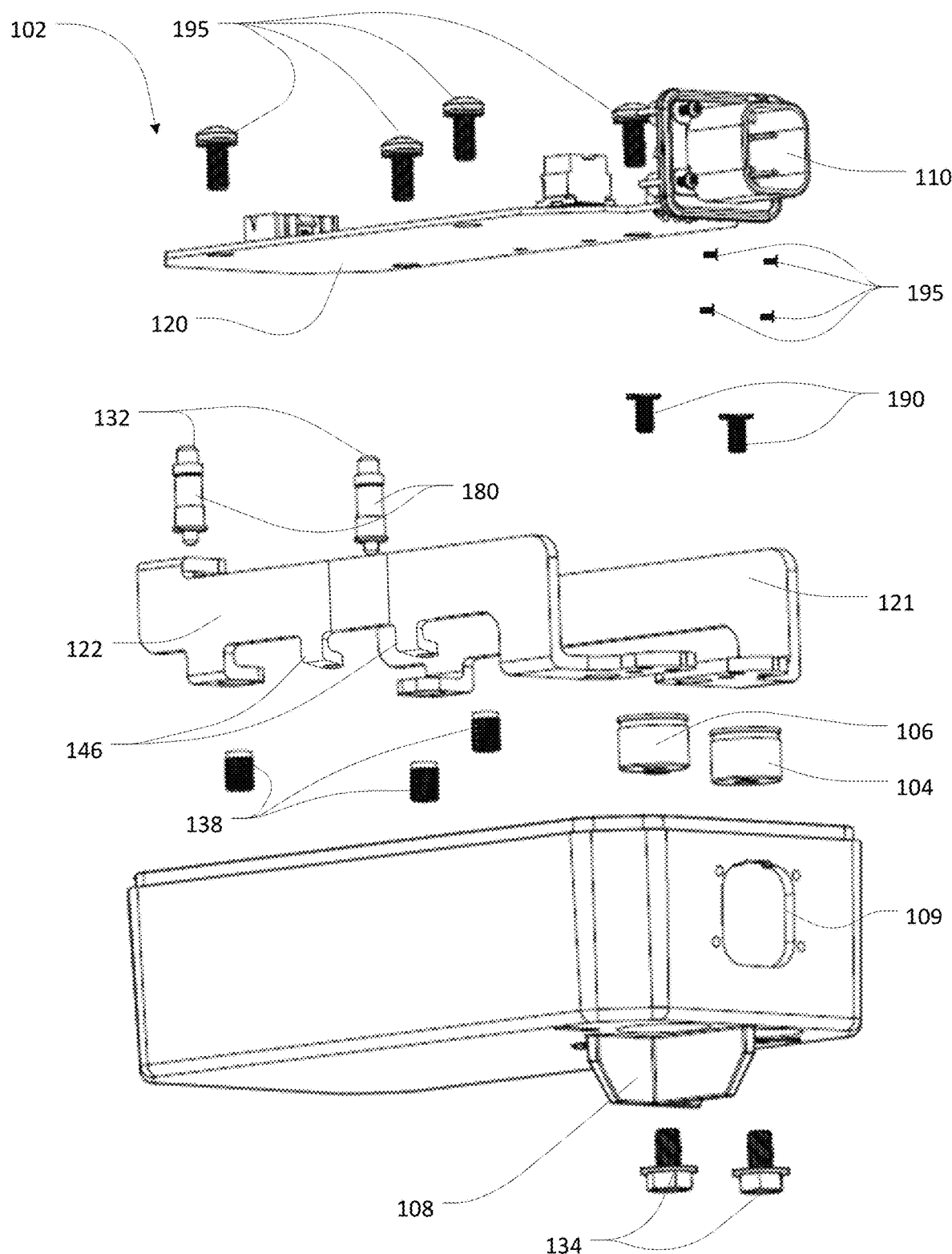
FIG. 9 is an exploded view of the upper portion of the battery of FIG. 1. As described herein, a battery monitoring system may include an integrated bus bar and PCB secured within the upper portion of the battery.
Figure 10:
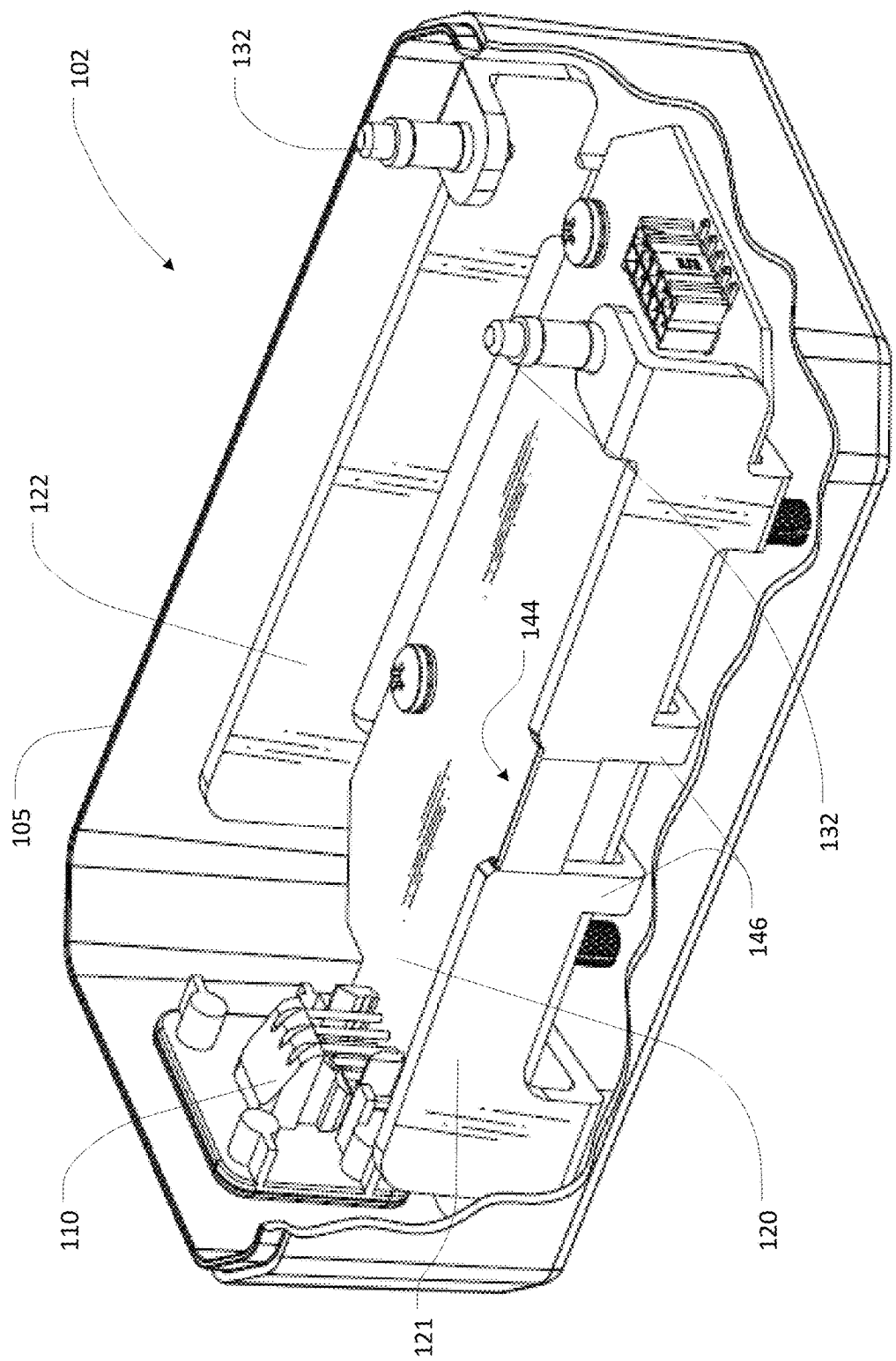
FIG. 10 is a perspective view with a partial cut-away of the upper portion of the battery housing illustrating the assembled battery monitoring system.

FIG. 9 illustrates a battery monitoring system that includes integrated bus bars 121, 122 and PCB 120 secured within the upper portion 102 of the battery. The upper portion 102 may be assembled as follows. First, the bus bars 121, 122 may be inserted within the upper portion 102. The bus bars 121, 122 may be secured to the upper portion 102 with the upper cover fasteners 190 along with the posts 106, 104 and terminal post fasteners 134. Next, the PCB 120 may be inserted and secured to the bus bars 121, 122 and upper portion 102 with the fasteners 136 and the inserts 138. The CAN connector 110 can be passed through opening 109 and secured with CAN fasteners 195. The pins 132 may then be passed through the sockets 180 and inserted at least partially into the bus bars 121, 122. The configuration in FIG. 9 is different from FIGS. 7-8 in that the positions of the positive bus and negative bars are reversed. FIG. 10 shows the assembled battery monitoring system within the upper portion 102.

Figure 11:
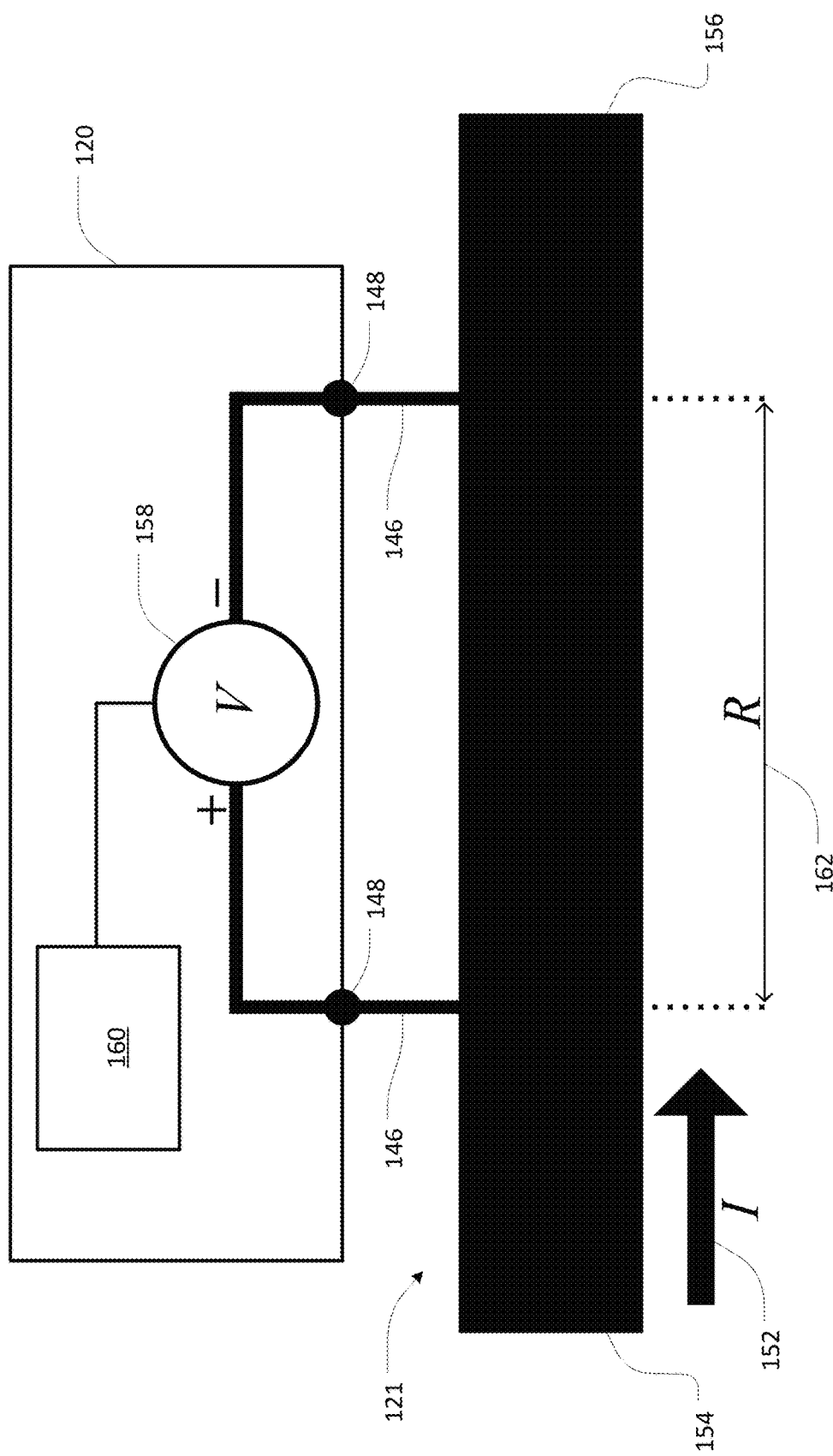
FIG. 11 is a block diagram showing the electrical connections between a bus bar and a PCB in accordance with an exemplary embodiment.

FIG. 11 is a block diagram showing the electrical connections between a bus bar 121 and current measurement circuitry of a PCB 120 in accordance with an exemplary embodiment. The battery current 152 flows through a bus bar 121. If the bus bar 121 is a positive bus bar of a vehicle battery, the current 152 may flow from a first end 154 connected to the positive terminals of one or more electrochemical cells (not shown), to a second end 156 connected to a positive terminal post (not shown) of the vehicle battery. As described above, the bus bar 121 may include an integrated shunt comprising shunt arms 146 configured to electrically connect two points along the bus bar 121 to the circuitry of the PCB 120 at connection points 148. The PCB 120 may include voltage measuring circuitry 158 configured to measure the voltage drop between the connection points 148 and transmit voltage drop information to processing circuitry 160 configured to calculate current 152.

When a current 152 flows through the bus bar 152 during operation of the battery, a relatively small voltage drop will be generated between the shunt arms 146 due to the nonzero resistance of the metal of the bus bar 121. The voltage drop will be proportional to the current 152 and the total resistance 162 of the portion of the bus bar located between the shunt arms 146. This voltage drop is measured by the voltage measuring circuitry 158 of the PCB 120, and may be transmitted to the processing circuitry 160. The processing circuitry 160 can calculate the magnitude of the current 152 using the equation $$I = \frac{V}{R}$$

where I is the magnitude of the current 152, V is the voltage drop measured by voltage measuring circuitry 158, and R is the known resistance 162 of the portion of the bus bar located between the shunt arms. The calculated battery current 152 may be used along with other data, such as voltage measurements, to monitor battery performance. Battery performance monitoring may be carried out by other circuitry located on the PCB 120, or by external circuitry which may be connected to the PCB 120 by means of a CAN connector (not shown), as described elsewhere herein.

Figure 12:
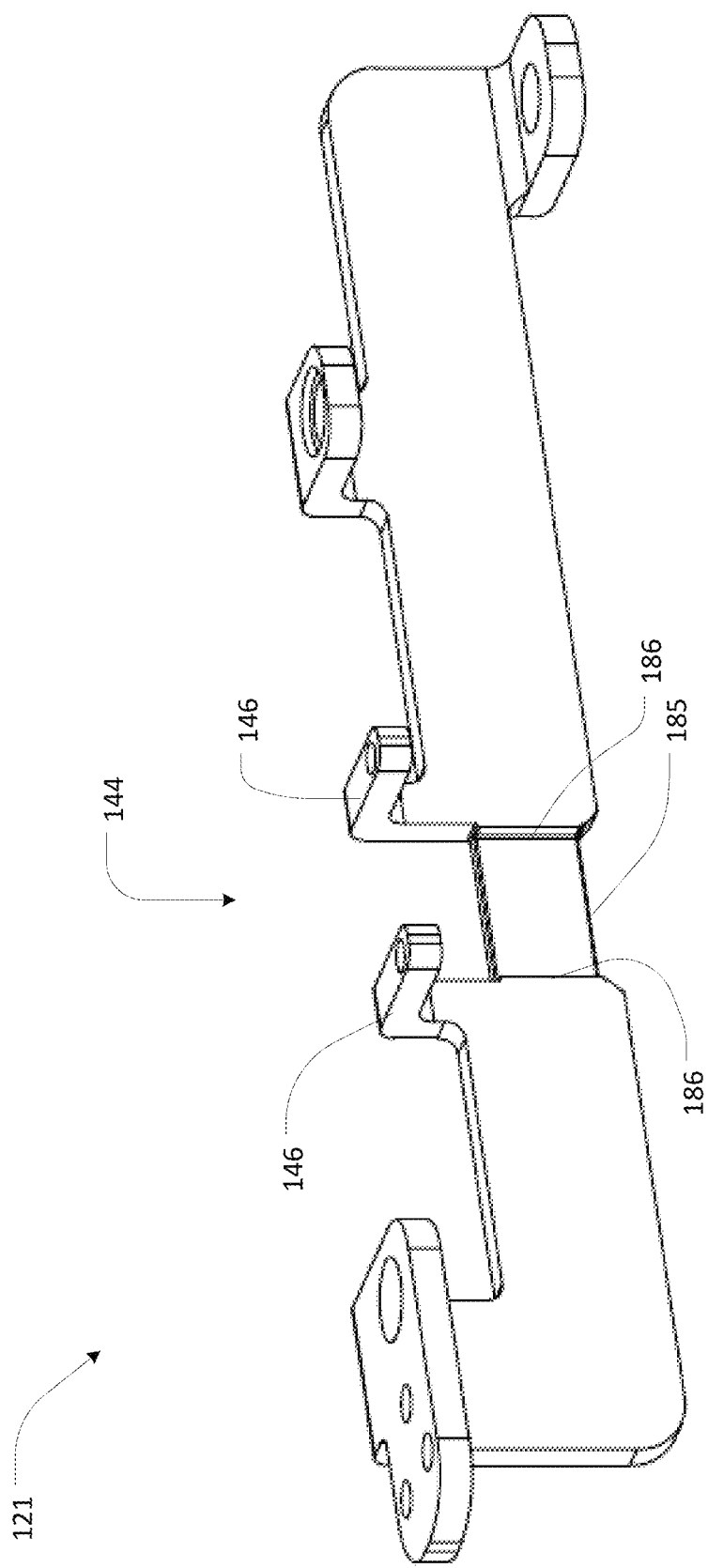
FIG. 12 is a perspective view of a bus bar with an integrated shunt in accordance with an exemplary embodiment.

FIG. 12 shows an example configuration of a bus bar 121 with an integrated shunt 144 configured for incorporation in the battery systems depicted elsewhere herein. As described above, the shunt 144 portion of the bus bar 121 comprises two shunt arms 146 configured to connect electrically to a PCB (not shown), where the voltage difference between the arms 146 can be used to calculate the total current flowing through the bus bar. This calculation, as described with reference to FIG. 11, relies on the known value of R, the resistance of the portion of the bus bar located between the shunt arms. Because an inaccurate R value will result in an inaccurate current calculation, it is important to know the resistance of the shunt 144 portion of the bus bar 121 to a high degree of accuracy.

Thus, the shunt 144 may include an integrated shunt connector 185 of known resistance. In some embodiments, the entire bus bar 121 including the shunt connector 185 may be formed at the same time as a single piece of one conducting material. In other embodiments, the shunt connector 185 may be formed separately from the remainder of the bus bar 121, and may be connected within the bus bar 121 at joints 186. Connection may be accomplished by welding or any other suitable method of joining the connector 185 and the bus bar 121. Integrating the shunt connector 185 in line with the remainder of the bus bar may be preferable to a connection with bolts or the like due to increased durability and/or enhanced accuracy of measurement.

The connector 185 may comprise the same material as the remainder of the bus bar 121, or may be made of a different material. In some embodiments, the connector 185 may be made of a material optimized to maintain a constant or nearly constant resistance over a range of temperatures so as to enable reliable current measurements regardless of operating temperature, which may vary from below −40° C. to 125° C. or greater. For example, the connector 185 may include an alloy such as Manganin or any other composition characterized by a small temperature coefficient of resistance.

The foregoing description details certain embodiments of the systems, devices, and methods disclosed herein. It will be appreciated, however, that no matter how detailed the foregoing appears in text, the devices and methods can be practiced in many ways. As is also stated above, it should be noted that the use of particular terminology when describing certain features or aspects of the invention should not be taken to imply that the terminology is being re-defined herein to be restricted to including any specific characteristics of the features or aspects of the technology with which that terminology is associated. The scope of the disclosure should therefore be construed in accordance with the appended claims and any equivalents thereof.

With respect to the use of any plural and/or singular terms herein, those having skill in the art can translate from the plural to the singular and/or from the singular to the plural as is appropriate to the context and/or application. The various singular/plural permutations may be expressly set forth herein for sake of clarity.

It is noted that the examples may be described as a process. Although the operations may be described as a sequential process, many of the operations can be performed in parallel, or concurrently, and the process can be repeated. In addition, the order of the operations may be rearranged. A process is terminated when its operations are completed. A process may correspond to a method, a function, a procedure, a subroutine, a subprogram, etc.

The previous description of the disclosed implementations is provided to enable any person skilled in the art to make or use the present disclosed process and system. Various modifications to these implementations will be readily apparent to those skilled in the art, and the generic principles defined herein may be applied to other implementations without departing from the spirit or scope of the disclosed process and system. Thus, the present disclosed process and system is not intended to be limited to the implementations shown herein but is to be accorded the widest scope consistent with the principles and novel features disclosed herein.

What is claimed is:

1. A battery monitoring system comprising:
    a plurality of electrochemical cells electrically connected together;
    a terminal post exposed to an exterior of an assembled battery;
    a bus bar configured to carry an output current of the assembled battery from the plurality of electrochemical cells to the terminal post;
    an integrated shunt connector comprising an intermediate portion of the bus bar having a predetermined resistance, wherein the integrated shunt connector provides a first electrical connection pathway from the plurality of electrochemical cells to the terminal post through the integrated shunt connector; and
    a printed circuit board secured to the bus bar and comprising circuitry configured to monitor current, the printed circuit boarded electrically connected to the bus bar by a first shunt arm located on a first side of the integrated shunt connector and a second shunt arm located on a second side of the integrated shunt connector opposite the first side, wherein the first shunt arm, the circuitry of the printed circuit board, and the second shunt arm provide a second electrical connection pathway from the plurality of electrochemical cells to the terminal post that is different from the first electrical connection pathway.

2. The battery monitoring system of claim 1, wherein the first shunt arm and the second shunt arm comprise transverse extensions of the bus bar.

3. The battery monitoring system of claim 2, wherein the first and second shunt arms, the integrated shunt connector, and the bus bar comprise a single contiguous piece of electrically conductive material.

4. The battery monitoring system of claim 2, wherein the printed circuit board has a first side and a second side, the circuitry including at least two contact points on the first side that are electrically connected to the first and second shunt arms.

5. The battery monitoring system of claim 4, wherein the bus bar includes at least one flange in contact with the first side.

6. A low voltage battery for an electric vehicle, the battery comprising:
    a housing having at least a first portion sealed to a second portion;
    a terminal post extending through the housing;
    a plurality of rechargeable electrochemical cells disposed within the first portion;
    a bus bar configured to carry electrical current between the plurality of electrochemical cells and the terminal post;
    a printed circuit board disposed within the second portion, the printed circuit board secured to the bus bar and comprising circuitry configured to monitor current;
    an integrated shunt connector comprising an intermediate portion of the bus bar having a predetermined resistance, wherein the integrated shunt connector provides a first electrical connection pathway from the plurality of electrochemical cells to the terminal post through the integrated shunt connector;
    a first shunt arm extending from the bus bar on a first side of the integrated shunt connector to the printed circuit board; and
    a second shunt arm extending from the bus bar on a second side of the integrated shunt connector to the printed circuit,
    wherein the first shunt arm, the circuitry of the printed circuit board, and the shunt arm provide a second electrical connection pathway from the electrochemical cells to the terminal post that is different from the first electrical connection pathway.

7. The battery of claim 6, wherein the first shunt arm and the second shunt arm comprise transverse extensions of the bus bar.

8. The battery of claim 7, wherein the first and second shunt arms, the integrated shunt connector, and the bus bar comprise a single contiguous piece of electrically conductive material.

9. The battery of claim 6, wherein the bus bar and the PCB are at least partially secured within the second portion.

10. A battery monitoring system comprising:
    a housing comprising a plurality of electrochemical cells electrically connected together;
    a terminal post exposed to an exterior of the housing;
    at least two bus bars secured to the housing, at least one of the at least two bus bars configured to carry an output current from the plurality of electrochemical cells to the terminal post;
    monitoring circuitry secured to the housing and the at least two bus bars, wherein at least a portion of the monitoring circuitry is in direct physical and electrical contact with the at least one bus bar by a first shunt arm located on a first side of an integrated shunt connector and a second shunt arm located on a second side of the integrated shunt opposite the first side, the monitoring circuitry configured to measure the current through the at least one bus bar and provide a first electrical connection from the plurality of electrochemical cells to the terminal post via the first shunt arm and the second shunt arm; and the integrated shunt connector comprising an intermediate portion of the at least one bus bar having a predetermined resistance, wherein the integrated shunt connector provides a second electrical connection between the first shunt arm and the second shunt arm.

11. The battery monitoring system of claim 10, wherein the least two bus bars are each secured to the housing at least in part by the terminal post extending through the housing.

12. The battery monitoring system of claim 10, wherein the least two bus bars comprise an elongated conducting path and at least one flange extending from a top surface of each bus bar.

13. The battery monitoring system of claim 10, wherein the at least one flange supports the monitoring circuitry from above.

14. The battery monitoring system of claim 10, wherein the least two bus bars include a connecting pin configured to electrically and mechanically couple the at least two bus bars to a battery circuit.

15. The battery monitoring system of claim 10, further comprising at least one fastener that secures at least one bus bar to both the monitoring circuitry and the housing.

16. The battery monitoring system of claim 1, wherein the first electrical connection provides for measurement of a voltage drop between the first shunt arm and the second shunt arm, and wherein the second electrical connection provides a current path through the bus bar.

17. The battery monitoring system of claim 10, wherein first shunt arm and the second shunt arm extend from the same at least one bus bar toward the portion of the monitoring circuitry.

* * * * *